United States Patent
Yamada et al.

(10) Patent No.: US 9,472,635 B2
(45) Date of Patent: Oct. 18, 2016

(54) SILICON CARBIDE SEMICONDUCTOR DEVICE

(71) Applicant: Sumitomo Electric Industries, Ltd., Osaka-shi (JP)

(72) Inventors: Shunsuke Yamada, Osaka (JP); Taku Horii, Osaka (JP); Masaki Kijima, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/769,472

(22) PCT Filed: Feb. 4, 2014

(86) PCT No.: PCT/JP2014/052543
§ 371 (c)(1),
(2) Date: Aug. 21, 2015

(87) PCT Pub. No.: WO2014/148131
PCT Pub. Date: Sep. 25, 2014

(65) Prior Publication Data
US 2016/0027891 A1    Jan. 28, 2016

(30) Foreign Application Priority Data

Mar. 22, 2013  (JP) .................. 2013-060076

(51) Int. Cl.
*H01L 29/78* (2006.01)
*H01L 29/49* (2006.01)
(Continued)

(52) U.S. Cl.
CPC ........... *H01L 29/4941* (2013.01); *H01L 21/28* (2013.01); *H01L 29/12* (2013.01);
(Continued)

(58) Field of Classification Search
CPC .................. H01L 29/4966; H01L 23/53223; H01L 23/53266; H01L 23/53252; H01L 29/4941; H01L 29/495
See application file for complete search history.

(56) References Cited

U.S. PATENT DOCUMENTS

2010/0102332 A1* 4/2010 Takahashi ........... H01L 21/0485 257/77
2011/0031507 A1   2/2011 Tamaso
2011/0175111 A1* 7/2011 Harada ............... H01L 21/0485 257/77
(Continued)

FOREIGN PATENT DOCUMENTS

JP  2009-194127 A   8/2009
JP  2010-272785 A   12/2010
(Continued)

OTHER PUBLICATIONS

International Search Report in PCT International Application No. PCT/JP2014/052543 dated May 20, 2014.
(Continued)

*Primary Examiner* — Dale E Page
*Assistant Examiner* — Paul Budd
(74) *Attorney, Agent, or Firm* — Venable LLP; Michael A. Sartori; Laura G. Remus

(57) ABSTRACT

A silicon carbide semiconductor device includes a silicon carbide substrate, a main electrode, a first barrier layer, and an interconnection layer. The main electrode is directly provided on the silicon carbide substrate. The first barrier layer is provided on the main electrode, and is made of a conductive material containing no aluminum. The interconnection layer is provided on the first barrier layer, is separated from the main electrode by the first barrier layer, and is made of a material containing aluminum.

11 Claims, 4 Drawing Sheets

(51) Int. Cl.
*H01L 29/40* (2006.01)
*H01L 29/45* (2006.01)
*H01L 29/66* (2006.01)
*H01L 29/16* (2006.01)
*H01L 21/28* (2006.01)
*H01L 29/417* (2006.01)
*H01L 29/12* (2006.01)
*H01L 21/336* (2006.01)

(52) U.S. Cl.
CPC ......... *H01L29/1608* (2013.01); *H01L 29/401* (2013.01); *H01L 29/417* (2013.01); *H01L 29/45* (2013.01); *H01L 29/495* (2013.01); *H01L 29/4966* (2013.01); *H01L 29/66068* (2013.01); *H01L 29/78* (2013.01); *H01L 29/7802* (2013.01)

(56) References Cited

U.S. PATENT DOCUMENTS

2012/0132912 A1* 5/2012 Suekawa ................. H01L 29/45
 257/49
2012/0171864 A1* 7/2012 Akiyama .......... H01L 21/28518
 438/675

FOREIGN PATENT DOCUMENTS

JP 2012-129503 A 7/2012
WO WO-2009/128382 A1 10/2009

OTHER PUBLICATIONS

Notice of Grounds of Rejection in Japanese Patent Application No. 2013-060076, dated May 31, 2016.

* cited by examiner

SILICON CARBIDE SEMICONDUCTOR DEVICE

TECHNICAL FIELD

The present invention relates to a silicon carbide semiconductor device, in particular, a silicon carbide semiconductor device provided with an interconnection layer made of a material containing aluminum.

BACKGROUND ART

An exemplary silicon carbide semiconductor device includes a silicon carbide substrate and a main electrode in ohmic contact with the silicon carbide substrate. For example, in the case of a MOSFET (Metal Oxide Semiconductor Field Effect Transistor), an ohmic electrode on a silicon carbide substrate is required as a source electrode serving as one of main electrodes. As an ohmic electrode having a low contact resistance, an ohmic electrode containing aluminum (Al) has been known. Moreover, on the ohmic electrode, an interconnection layer is usually provided. Such an interconnection layer is often made of a material such as Al or an alloy thereof. For example, WO 2009/128382 (Patent Document 1) discloses a MOSFET including: a source electrode containing Ti, Al, and Si; and an interconnection layer provided thereon and made of Al.

CITATION LIST

Patent Document

PTD 1: WO 2009/128382

SUMMARY OF INVENTION

Technical Problem

In the conventional technique, Al atoms in the interconnection layer may be diffused into the main electrode, thereby varying an Al atom concentration in the main electrode. As a result, the characteristic of the main electrode may be varied.

The present invention has been made to solve the foregoing problem. The present invention has a main object to provide a silicon carbide semiconductor device provided with a main electrode having a stable characteristic.

Solution to Problem

A silicon carbide semiconductor device of the present invention includes a silicon carbide substrate, a main electrode, a first barrier layer, and an interconnection layer. The main electrode is directly provided on the silicon carbide substrate. The first barrier layer is provided on the main electrode, and is made of a conductive material containing no aluminum. The interconnection layer is provided on the first barrier layer, is separated from the main electrode by the first barrier layer, and is made of a material containing aluminum.

Advantageous Effects of Invention

According to the present invention, by suppressing variation in aluminum atom concentration in the main electrode, the characteristic of the main electrode can be suppressed from being varied.

DESCRIPTION OF EMBODIMENTS

Figure 1:
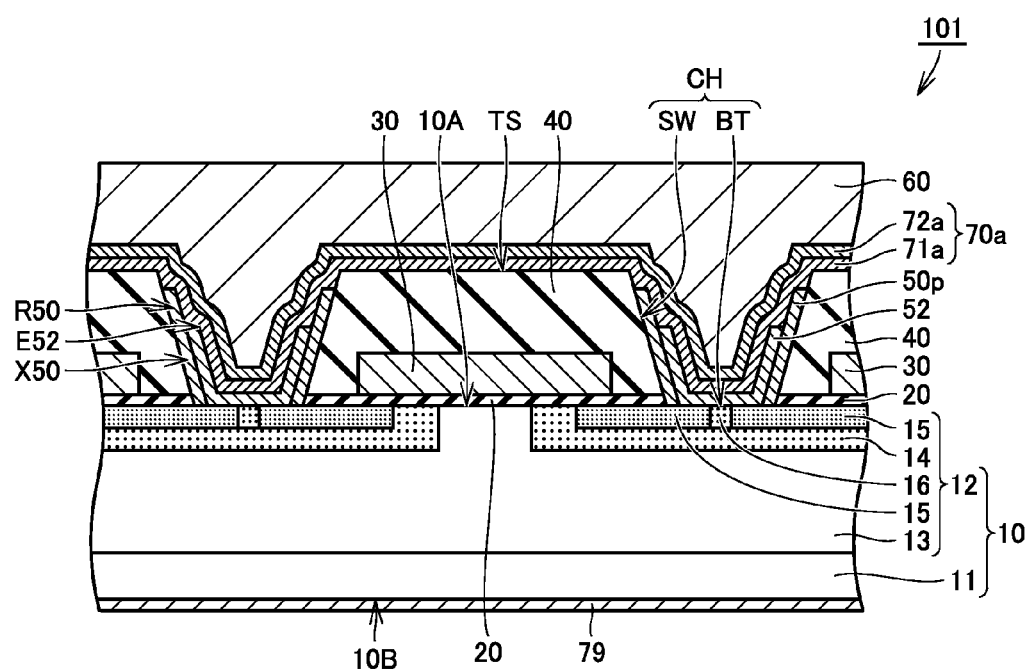
FIG. 1 is a partial cross sectional view schematically showing a configuration of a silicon carbide semiconductor device in a first embodiment of the present invention.

The following describes embodiments of the present invention with reference to figures. It should be noted that in the below-mentioned figures, the same or corresponding portions are given the same reference characters and are not described repeatedly.

First, the overview of embodiments will be described with regard to (i) to (xiii) as follows.

(i) Each of silicon carbide semiconductor devices 101 to 104 includes a silicon carbide substrate 10, a main electrode 52, a first barrier layer 70a, 70p, and an interconnection layer 60. Main electrode 52 is directly provided on silicon carbide substrate 10. First barrier layer 70a, 70p is provided on main electrode 52, and is made of a conductive material containing no aluminum. Interconnection layer 60 is provided on first barrier layer 70a, 70p, is separated from main electrode 52 by first barrier layer 70a, 70p, and is made of a material containing aluminum.

According to each of silicon carbide semiconductor devices 101 to 104, first barrier layer 70a, 70p is provided between interconnection layer 60 and main electrode 52, thereby suppressing aluminum atoms in interconnection layer 60 from being diffused into main electrode 52. Accordingly, the aluminum atom concentration in main electrode 52 can be suppressed from being varied. Therefore, it is possible to suppress variation in characteristic of main electrode 52, in particular, ohmic characteristic.

(ii) Main electrode 52 may have aluminum added therein. Accordingly, the contact resistance of main electrode 52 can be reduced. Further, the reduction of the contact resistance by the addition of aluminum can be attained stably by suppressing the variation in the aluminum atom concentration as described above.

(iii) Each of silicon carbide semiconductor devices 101 to 104 may further include a gate electrode 30 and an interlayer insulating film 40. Gate electrode 30 is provided on silicon carbide substrate 10. Interlayer insulating film 40 is provided on the gate electrode to provide insulation between the gate electrode and interconnection layer 60, and has a contact hole CH. Main electrode 52 is in contact with silicon carbide substrate 10 in contact hole CH. First barrier layer 70a, 70p includes a portion located between interconnection layer 60 and interlayer insulating film 40.

Accordingly, first barrier layer 70a, 70p is provided between interconnection layer 60 and interlayer insulating film 40. Therefore, the aluminum atoms in interconnection layer 60 can be suppressed from being diffused into interlayer insulating film 40. Therefore, interlayer insulating film 40 is suppressed from being deteriorated.

(iv) First barrier layer 70a, 70p may include a portion X70 extending to an end portion E52 of main electrode 52 on main electrode 52, and a portion R70 further extending from end portion E52.

Accordingly, first barrier layer 70a, 70p can more securely prevent diffusion of the Al atoms.

(v) First barrier layer 70a may entirely cover main electrode 52 and interlayer insulating film 40.

Accordingly, first barrier layer 70a can prevent the Al atoms from being diffused entirely into interlayer insulating film 40. Therefore, interlayer insulating film 40 is further suppressed from being deteriorated.

(vi) Each of silicon carbide semiconductor devices 101 to 104 may further include a second barrier layer 50a, 50p. Second barrier layer 50a, 50p is directly provided on interlayer insulating film 40, and separates interlayer insulating film 40 and main electrode 52 from each other. Second barrier layer 50a, 50p is made of a material different from a material containing aluminum.

Accordingly, the aluminum atoms in main electrode 52 can be suppressed from being diffused into interlayer insulating film 40. Therefore, interlayer insulating film 40 is further suppressed from being deteriorated.

(vii) Second barrier layer 50a, 50p may have a portion X50 extending to an end portion E52 of main electrode 52 on main electrode 52, and a portion R50 further extending from end portion E52.

Accordingly, second barrier layer 50a, 50p can more securely prevent diffusion of the Al atoms.

(viii) Second barrier layer 50a may entirely cover interlayer insulating film 40.

Accordingly, second barrier layer 50a can prevent the diffusion of the Al atoms entirely into interlayer insulating film 40. Therefore, interlayer insulating film 40 is further suppressed from being deteriorated.

(ix) First barrier layer 70a, 70p may have a multilayer structure.

Accordingly, suitable materials can be selected independently for portion 71a, 71p facing main electrode 52 and portion 72a, 72p facing interconnection layer 60 in first barrier layer 70a, 70p.

(x) First barrier layer 70a, 70p may include a metal layer.

(xi) The metal layer may be one of a Ti layer, a TiW layer, a Au layer and a Pt layer.

(xii) First barrier layer 70a, 70p may include a TiN layer 72a, 72p.

(xiii) First barrier layer 70a, 70p may include a Ti layer 71a, 71p provided between TiN layer 72a, 72p and main electrode 52, Ti layer 71a, 71p being in contact with each of TiN layer 72a, 72p and main electrode 52.

Next, the following describes first to fourth embodiments as more detailed description of the embodiments of the invention of the present application.

(First Embodiment)

With reference to FIG. 1, a MOSFET 101 (silicon carbide semiconductor device) has an epitaxial substrate 10 (silicon carbide substrate), a gate insulating film 20, a gate electrode 30, interlayer insulating films 40, source electrodes 52 (main electrode), a drain electrode 79, a first barrier layer 70a, a second barrier layer 50p, and an interconnection layer 60.

Epitaxial substrate 10 is made of silicon carbide. Epitaxial substrate 10 has a base substrate 11 and an epitaxial layer 12. Epitaxial layer 12 constitutes a main surface 10A of epitaxial substrate 10. Base substrate 11 constitutes a main surface 10B of epitaxial substrate 10. Epitaxial layer 12 has a drift region 13, body regions 14, source regions 15, and contact regions 16. Base substrate 11 contains an n type impurity such as N (nitrogen) and therefore has n type conductivity (first conductivity type).

Drift region 13 is an epitaxial growth layer formed on a main surface of base substrate 11. As with base substrate 11, drift region 13 contains a donor such as N (nitrogen), and therefore has n type conductivity. The concentration thereof in drift region 13 is lower than that in base substrate 11. Each of body regions 14 includes a portion located on main surface 10A of epitaxial substrate 10. Body region 14 contains an acceptor such as Al (aluminum) or B (boron), and therefore has p type conductivity (second conductivity type). Each of source regions 15 includes a portion located on main surface 10A, and is formed in each of body regions 14 such that they are surrounded by body regions 14. Source region 15 contains a donor such as P (phosphorus), and therefore has n type conductivity as with base substrate 11 and drift region 13. Further, the concentration of the n type impurity in source region 15 is higher than the concentration of the n type impurity in drift region 13. As with source region 15, contact regions 16 include portions located on main surface 10A, are surrounded by body regions 14, and are respectively formed in body regions 14 so as to be adjacent to source regions 15. As with body region 14, each of contact regions 16 contains an acceptor such as Al (aluminum) or B (boron) and therefore has p type conductivity. The concentration thereof in contact region 16 is higher than that in body region 14.

Gate insulating film 20 is preferably a $SiO_2$ (silicon dioxide) film, and is a thermal oxidation film, for example. Gate insulating film 20 has a portion covering body region 14 between source region 15 and drift region 13 on main surface 10A. Gate electrode 30 is provided on epitaxial substrate 10 with gate insulating film 20 being interposed therebetween. Gate electrode 30 has a portion facing body region 14 between source region 15 and drift region 13 with gate insulating film 20 being interposed therebetween. Gate electrode 30 is made of a conductor, such as polysilicon having an impurity added therein. It should be noted that the material of gate insulating film 20 is not limited to $SiO_2$, and gate insulating film 20 may be made of $Si_3N_4$.

Interlayer insulating film 40 is formed to surround gate electrode 30 on gate insulating film 20. Interlayer insulating film 40 is provided on gate electrode 30 to provide insulation between gate electrode 30 and interconnection layer 60. Interlayer insulating film 40 has contact holes CH each disposed away from gate electrode 30. Contact hole CH includes: a bottom BT via which main surface 10A of epitaxial substrate 10 is partially exposed; and a side wall surface SW surrounding bottom BT. Contact hole CH is formed to expose each of source region 15 and contact region 16. Interlayer insulating film 40 is a $SiO_2$ (silicon dioxide) film, for example.

Source electrode 52 is directly provided on epitaxial substrate 10 in contact with epitaxial substrate 10. Specifically, in contact hole CH, source electrode 52 is in contact with each of source region 15 and contact region 16. Source electrode 52 has portions located on side wall surface SW of interlayer insulating film 40 and the end surface of gate insulating film 20 with second barrier layer 50p being interposed therebetween. Accordingly, source electrode 52 is separated from each of interlayer insulating film 40 and gate insulating film 20. Preferably, source electrode 52 has aluminum added therein, and is made of a TiAlSi alloy, for example.

First barrier layer 70a is provided on source electrode 52. First barrier layer 70a is made of a conductive material containing no aluminum. First barrier layer 70a entirely covers source electrode 52 and interlayer insulating film 40. First barrier layer 70a includes a portion located between interconnection layer 60 and interlayer insulating film 40. First barrier layer 70a may have a multilayer structure. In the present embodiment, first barrier layer 70a has a lower layer 71a and an upper layer 72a provided on lower layer 71a. First barrier layer 70a may also include a metal layer. The metal layer may be one of a Ti layer, a TiW layer, a Au layer and a Pt layer. First barrier layer 70a may include a TiN layer. Specifically, upper layer 72a may be a TiN layer. First barrier layer 70a may have a Ti layer as lower layer 71a. This Ti layer may be provided between a TiN layer serving as upper layer 72a and source electrode 52, and may be in contact with each of the TiN layer and source electrode 52.

Second barrier layer 50p is provided directly on interlayer insulating film 40 to separate interlayer insulating film 40 and source electrode 52 from each other. Second barrier layer 50p has a parallel portion X50, which is a portion extending to end portion E52 of source electrode 52 on source electrode 52. Second barrier layer 50p preferably has an extension portion R50, which is a portion further extending from end portion E52. Second barrier layer 50p is made of a material different from a material containing aluminum. Moreover, second barrier layer 50p is made of a material different from $SiO_2$. Second barrier layer 50p may be made of the same material as the material suitable for first barrier layer 70a, such as titanium nitride (TiN), tungsten nitride (TiW), or tantalum nitride (TaN). Second barrier layer 50p preferably has a thickness of not less than 25 nm and not more than 150 nm.

Interconnection layer 60 is provided on first barrier layer 70a, and is separated from source electrode 52 by first barrier layer 70a. Interconnection layer 60 is made of a material containing Al, and is made of Al, for example. Interconnection layer 60 is connected to source region 15 through first barrier layer 70a and source electrode 52.

Drain electrode 79 is formed on main surface 10B of epitaxial substrate 10 opposite to main surface 10A. Drain electrode 79 is made of the same material as the material suitable for source electrode 52, such as a TiAlSi alloy.

According to the present embodiment, first barrier layer 70a is provided between interconnection layer 60 and source electrode 52, thereby suppressing aluminum atoms in interconnection layer 60 from being diffused into source electrode 52. Accordingly, the Al atom concentration in source electrode 52 can be suppressed from being varied. Therefore, it is possible to suppress variation in characteristic of source electrode 52, in particular, ohmic characteristic.

When source electrode 52 has Al added therein, the contact resistance of source electrode 52 can be reduced. Further, the reduction of the contact resistance by the addition of Al can be attained stably by suppressing the variation in the Al atom concentration as described above.

First barrier layer 70a includes a portion located between interconnection layer 60 and interlayer insulating film 40. Accordingly, first barrier layer 70a is provided between interconnection layer 60 and interlayer insulating film 40. Therefore, the Al atoms in interconnection layer 60 can be suppressed from being diffused into interlayer insulating film 40. Therefore, interlayer insulating film 40 is suppressed from being deteriorated.

First barrier layer 70a entirely covers source electrode 52 and interlayer insulating film 40. Accordingly, first barrier layer 70a can prevent the Al atoms from being diffused entirely into interlayer insulating film 40. Therefore, interlayer insulating film 40 is further suppressed from being deteriorated.

When first barrier layer 70a has lower layer 71a and upper layer 72a as a multilayer structure, materials suitable for lower layer 71a and upper layer 72a can be selected independently. Specifically, a material having high adhesion to source electrode 52 (such as Ti) is selected as the material of lower layer 71a, whereas a material suitable for suppression of diffusion of Al (such as TiN) can be selected as a material of upper layer 72a.

Second barrier layer 50p suppresses the Al atoms in source electrode 52 from being diffused into interlayer insulating film 40. Therefore, interlayer insulating film 40 is further suppressed from being deteriorated. When second barrier layer 50p has extension portion R50, second barrier layer 50p can prevent the diffusion of the Al atoms more securely.

Figure 2:
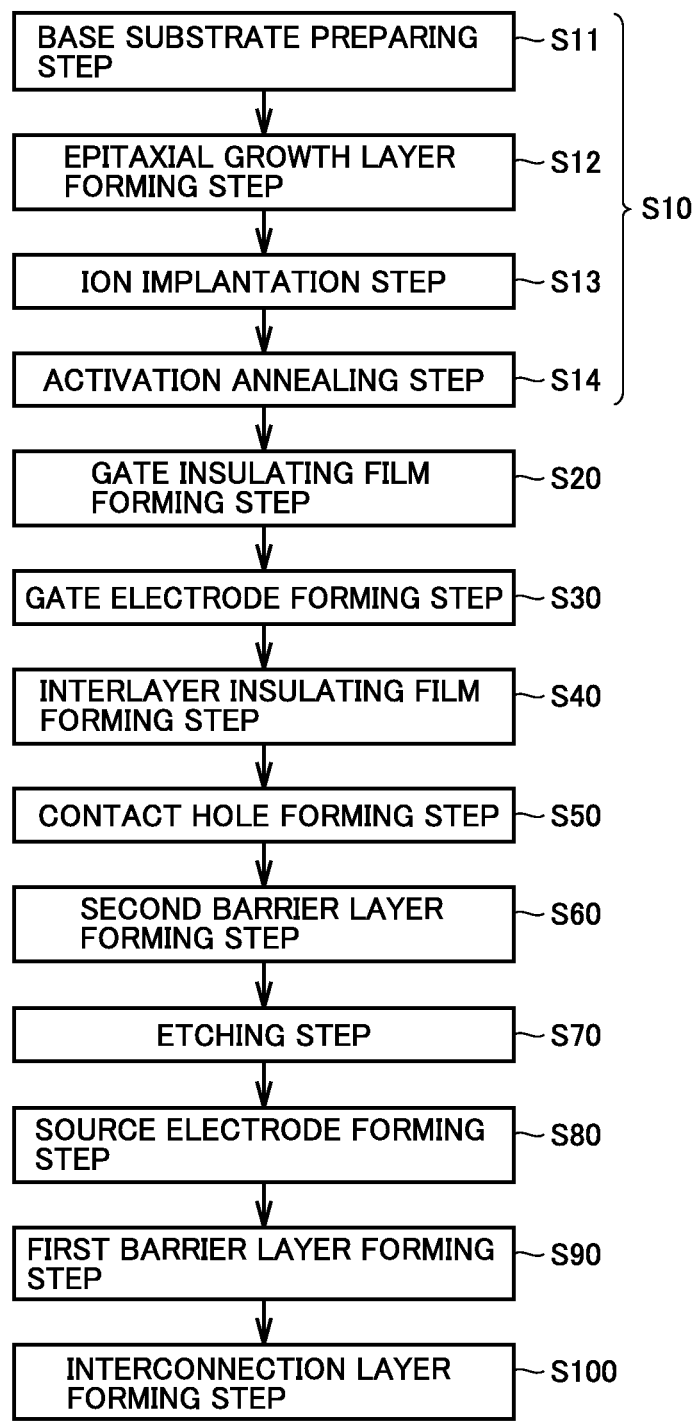
FIG. 2 is a flowchart schematically showing a method for manufacturing the silicon carbide semiconductor device of FIG. 1.

With reference to FIG. 2, the following describes one example of a method for manufacturing MOSFET 101.

First, a substrate preparing step (S10) is performed. In step (S10), epitaxial substrate 10 is prepared by performing steps (S11) to (S14). First, as step (S11), a base substrate preparing step is performed. In this step (511), an ingot made of, for example, 4H—SiC is sliced to prepare base substrate 11 having n type conductivity. Next, as step (S12), an epitaxial growth layer forming step is performed. In this step (S12), epitaxial layer 12 having n type conductivity is formed by epitaxial growth on the main surface of base substrate 11. Next, as step (S13), an ion implantation step is performed. In this step (S13), for example, Al ions are first implanted into regions including main surface 10A of epitaxial substrate 10, thereby forming body regions 14 of p type conductivity in epitaxial layer 12. Next, for example, P ions are implanted into each of body regions 14 at a depth shallower than the depth in which the Al ions have been implanted, thereby forming source region 15 of n type conductivity. Then, for example, Al ions are further implanted into body region 14, thereby forming contact region 16 adjacent to source region 15, having the same depth as that of source region 15, and having p type conductivity. Further, in epitaxial layer 12, a region in which none of body region 14, source region 15, and contact region 16 is formed serves as drift region 13. Next, as step (S14), an activation annealing step is performed. In this step (S14), by heating epitaxial substrate 10, the impurities implanted in step (S13) are activated. Accordingly, desired carriers are generated in the regions having the impurities implanted therein. By performing the above-mentioned steps (S11) to (S14), epitaxial substrate 10 is prepared.

Next, as a step (S20), a gate insulating film forming step is performed. In this step (S20), epitaxial substrate 10 is thermally oxidized in, for example, an atmosphere including oxygen, thereby forming gate insulating film 20 covering main surface 10A of epitaxial substrate 10.

Next, as a step (S30), a gate electrode forming step is performed. In this step (S30), for example, an LPCVD (Low Pressure Chemical Vapor Deposition) method is employed to form, on gate insulating film 20, gate electrode 30 made of polysilicon containing an impurity.

Next, as a step (S40), an interlayer insulating film forming step is performed. In this step (S40), for example, a P (Plasma)-CVD method is employed to form interlayer insulating film 40 made of $SiO_2$ (silicon dioxide) on gate insulating film 20 such that interlayer insulating film 40 and gate insulating film 20 surround gate electrode 30.

Next, as a step (S50), a contact hole forming step is performed. Specifically, for example, reactive ion etching (ME) is employed to etch through interlayer insulating film 40 and gate insulating film 20, thereby forming contact hole CH.

Next, as a step (S60), a second barrier layer forming step is performed. In this step (S60), for example, sputtering is employed to form second barrier layer 50p on and in contact with bottom BT and side wall surface SW of contact hole CH and the upper surface of interlayer insulating film 40.

Next, as a step (S70), an etching step is performed. In this step (S70), second barrier layer 50p is patterned. Specifically, a resist pattern is formed on a region in which second barrier layer 50p will remain, and dry etching is performed from the main surface 10A side of epitaxial substrate 10 using this resist pattern as a mask. This removes portions of second barrier layer 50p formed on the upper surface of interlayer insulating film 40 and bottom BT of contact hole CH, thereby forming second barrier layer 50p to extend from bottom BT on side wall surface SW upwardly. On this occasion, in contact hole CH, main surface 10A of epitaxial substrate 10 (upper surfaces of source region 15 and contact region 16) is exposed again.

Next, as a step (S80), a source electrode forming step is performed. In this step (S80), source electrode 52 is formed on main surface 10A and drain electrode 79 is formed on main surface 10B. Sputtering is employed, for example, to form, on main surface 10A, a laminate film including: a first metal film including Ti; a second metal film disposed on and in contact with the first metal layer and including Al; and a third metal film disposed on and in contact with the second metal layer and including Si. It should be noted that instead of the laminate film, Ti, Al, and Si may be simultaneously sputtered to form a mixed film having Ti, Al, and Si mixed therein. Next, the laminate film (or mixed film) is patterned. Also, the above-described laminate film or mixed film is formed on main surface 10B. Next, an alloying annealing step is performed. With this step, Ti, Al, and Si are alloyed, thereby forming source electrode 52 and drain electrode 79, which are made of the TiAlSi alloy and are in ohmic contact with epitaxial substrate 10. The annealing temperature may be, for example, approximately 1000° C.

Next, as a step (S90), first barrier layer 70a is formed. Specifically, lower layer 71a is formed and upper layer 72a is formed on lower layer 71a.

Next, an interconnection forming step is performed as a step (S100). In this step (S100), for example, a deposition method is employed to form interconnection layer 60, which is made of a conductor such as Al, on and in contact with source electrode 52.

By performing steps (S10) to (S100), MOSFET 101 can be manufactured.

(Second Embodiment)

Figure 3:
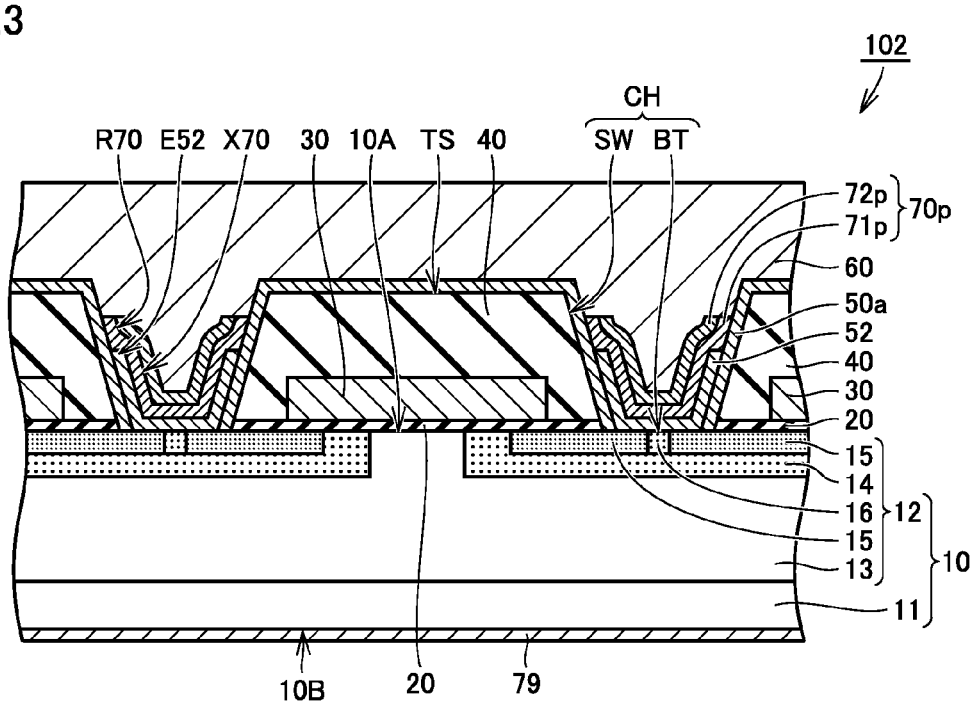
FIG. 3 is a partial cross sectional view schematically showing a configuration of a silicon carbide semiconductor device in a second embodiment of the present invention.

With reference to FIG. 3, a MOSFET 102 (silicon carbide semiconductor device) of the present embodiment has a first barrier layer 70p and a second barrier layer 50a. First barrier layer 70p has a lower layer 71p and an upper layer 72p as a multilayer structure. Unlike first barrier layer 70a (FIG. 1), first barrier layer 70p covers interlayer insulating film 40 partially, rather than entirely. First barrier layer 70a includes: a parallel portion X70, which is a portion extending to end portion E52 of source electrode 52 on source electrode 52; and an extension portion R70, which is a portion extending further from end portion E52. Second barrier layer 50a entirely covers interlayer insulating film 40. Apart from the configuration described above, the configuration of the present embodiment is substantially the same as the configuration of the first embodiment. Hence, the same or corresponding elements are given the same reference characters and are not described repeatedly.

According to the present embodiment, extension portion R70 provided in first barrier layer 70p allows first barrier layer 70p to more securely prevent the diffusion of Al atoms as compared with a case where first barrier layer 70p is constituted only of parallel portion X70. Moreover, second barrier layer 50a entirely covering interlayer insulating film 40 prevents Al atoms from being diffused entirely into interlayer insulating film 40. Therefore, interlayer insulating film 40 is further suppressed from being deteriorated.

(Third Embodiment)

Figure 4:
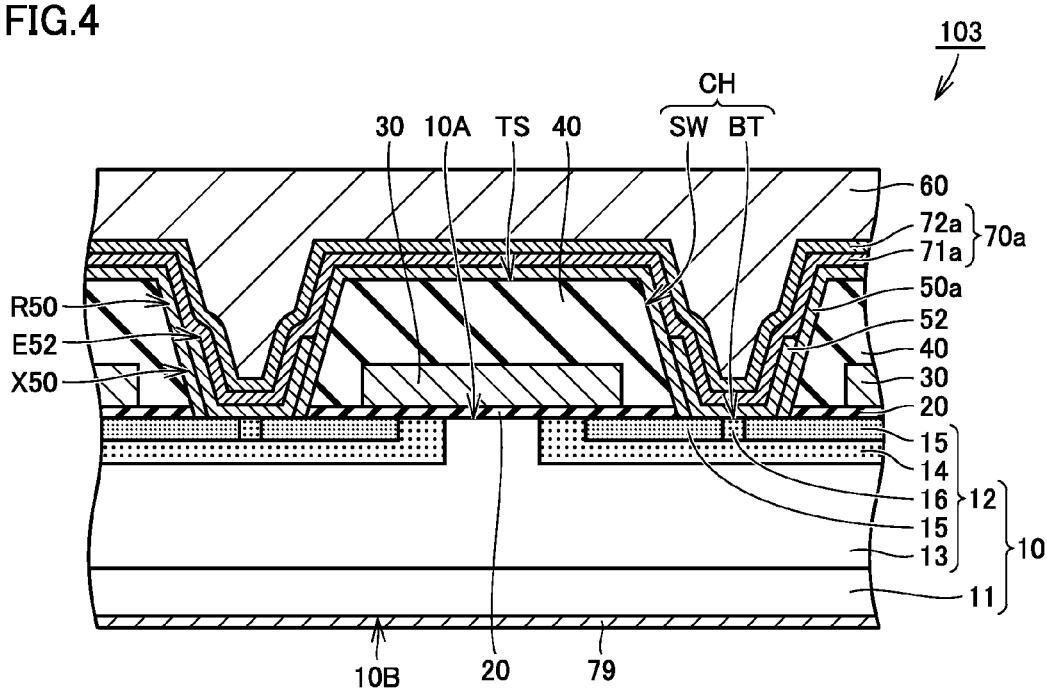
FIG. 4 is a partial cross sectional view schematically showing a configuration of a silicon carbide semiconductor device in a third embodiment of the present invention.

With reference to FIG. 4, a MOSFET 103 of the present embodiment (silicon carbide semiconductor device) has first barrier layer 70a and second barrier layer 50a. Apart from the configuration described above, the configuration of the present embodiment is substantially the same as the configuration of the first or second embodiment. Hence, the same or corresponding elements are given the same reference characters and are not described repeatedly.

(Fourth Embodiment)

Figure 5:
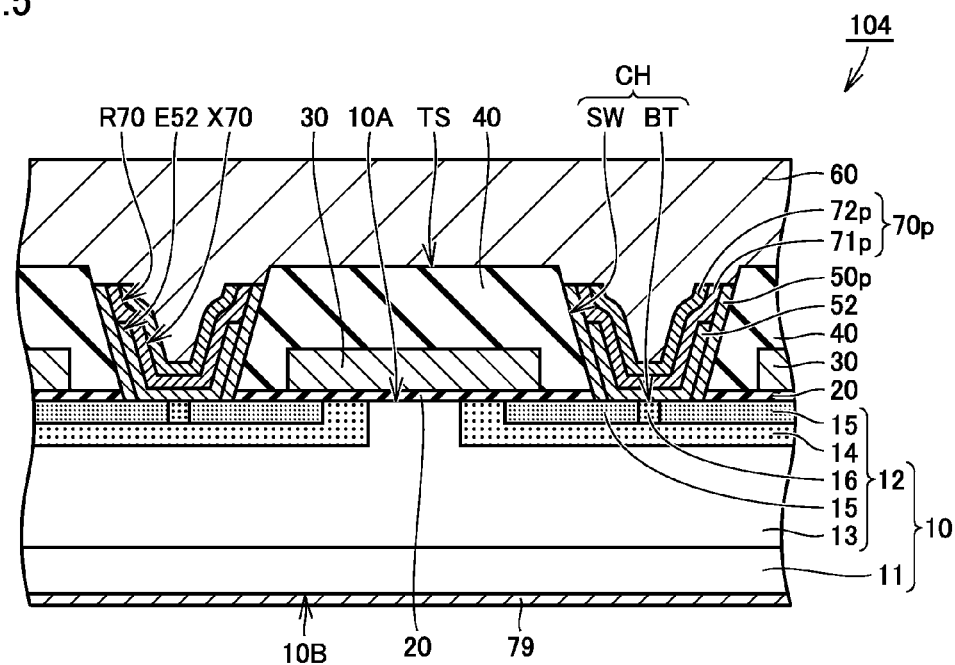
FIG. 5 is a partial cross sectional view schematically showing a configuration of a silicon carbide semiconductor device in a fourth embodiment of the present invention.

With reference to FIG. 5, a MOSFET 104 of the present embodiment (silicon carbide semiconductor device) has first barrier layer 70p and second barrier layer 50p. Apart from the configuration described above, the configuration of the present embodiment is substantially the same as the configuration of the first to third embodiments. Hence, the same or corresponding elements are given the same reference characters and are not described repeatedly.

In each of the above-mentioned embodiments, the planer type has been illustrated as the gate structure of the MOSFET, but the gate structure may be a trench type. Moreover, the silicon carbide semiconductor device may be a transistor other than the MOSFET, such as an IGBT (Insulated Gate Bipolar Transistor) having an emitter electrode as a main electrode. Moreover, the transistor is not limited to one having an insulated gate, and may be a junction field effect transistor having a junction gate, for example. Moreover, the silicon carbide semiconductor device is not limited to the transistor, and may have other elements such as a diode instead of or in addition to the transistor.

Although the embodiments of the present invention have been explained as described above, the embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

10: epitaxial substrate (silicon carbide substrate); 10A, 10B: main surface; 11: base substrate; 12: epitaxial layer; 13: drift region; 14: body region; 15: source region; 16: contact region; 20: gate insulating film; 30: gate electrode; 40: interlayer insulating film; 50a, 50p: second barrier layer; 52: source electrode (main electrode); 60: interconnection layer; 70a, 70a: first barrier layer; 71a, 71p: lower layer; 72a, 72p: upper layer; 79: drain electrode; 101 to 104: MOSFET (silicon carbide semiconductor device); BT: bottom; CH: contact hole; E52: end portion; R50, R70: extension portion; SW: side wall surface; X50, X70: parallel portion.

The invention claimed is:

1. A silicon carbide semiconductor device comprising:
a silicon carbide substrate;
a main electrode directly provided on said silicon carbide substrate;
a first barrier layer provided on said main electrode, said first barrier layer being made of a conductive material containing no aluminum;
an interconnection layer provided on said first barrier layer, said interconnection layer being separated from said main electrode by said first barrier layer, said interconnection layer being made of a material containing aluminum;
a gate electrode provided on said silicon carbide substrate;
an interlayer insulating film provided on said gate electrode to provide insulation between said gate electrode and said interconnection layer, said interlayer insulating film having a contact hole, said main electrode being in contact with said silicon carbide substrate in said contact hole; and
a second barrier layer directly provided on said interlayer insulating film, said second barrier layer separating said interlayer insulating film and said main electrode from each other, said second barrier layer being made of a material different from a material containing aluminum,
wherein said first barrier layer includes a portion located between said interconnection layer and said interlayer insulating film, and
wherein said first barrier layer has a multilayer structure.

2. The silicon carbide semiconductor device according to claim 1, wherein said main electrode has aluminum added therein.

3. The silicon carbide semiconductor device according to claim 1, wherein said first barrier layer includes a portion extending to an end portion of said main electrode on said main electrode, and a portion further extending from said end portion.

4. The silicon carbide semiconductor device according to claim 1, wherein said first barrier layer entirely covers said main electrode and said interlayer insulating film.

5. The silicon carbide semiconductor device according to claim 1, wherein said second barrier layer has a portion extending to an end portion of said main electrode on said main electrode, and a portion further extending from said end portion.

6. The silicon carbide semiconductor device according to claim 1, wherein said second barrier layer entirely covers said interlayer insulating film.

7. The silicon carbide semiconductor device according to claim 1, wherein said first barrier layer includes a metal layer.

8. The silicon carbide semiconductor device according to claim 7, wherein said metal layer is one of a Ti layer, a TiW layer, a Au layer and a Pt layer.

9. The silicon carbide semiconductor device according to claim 1, wherein said first barrier layer includes a TiN layer.

10. The silicon carbide semiconductor device according to claim 9, wherein said first barrier layer includes a Ti layer provided between said TiN layer and said main electrode, said Ti layer being in contact with each of said TiN layer and said main electrode.

11. The silicon carbide semiconductor device according to claim 1, wherein said second barrier layer is made of one of TiN, TiW, and TaN.

* * * * *